US012506497B2

(12) United States Patent
Ziomek

(10) Patent No.: US 12,506,497 B2
(45) Date of Patent: Dec. 23, 2025

(54) ENCODING OVER MULTIPLE DATA CHANNELS

(71) Applicant: Analog Devices, Inc., Wilmington, MA (US)

(72) Inventor: Jason Joseph Ziomek, South Burlington, VT (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 18/618,959

(22) Filed: Mar. 27, 2024

(65) Prior Publication Data
US 2025/0309923 A1 Oct. 2, 2025

(51) Int. Cl.
*H03M 13/45* (2006.01)
*H03M 13/00* (2006.01)

(52) U.S. Cl.
CPC ......... *H03M 13/45* (2013.01); *H03M 13/611* (2013.01)

(58) Field of Classification Search
None
See application file for complete search history.

(56) References Cited

U.S. PATENT DOCUMENTS 9,362,954 B1 * 6/2016 Sridhara ............ H03M 13/1111
10,826,536 B1 11/2020 Beukema et al.
2004/0109509 A1 6/2004 Stonecypher et al.
2008/0031286 A1 2/2008 Alfano et al.
2009/0179788 A1 7/2009 Harper
2010/0332701 A1 * 12/2010 Murayama ............ G06F 13/385
710/316
2019/0033910 A1 * 1/2019 Eder ..................... G06F 13/40
2021/0160098 A1 5/2021 Van Den Keybus
2023/0361786 A1 * 11/2023 Melton .................. H03M 7/48

FOREIGN PATENT DOCUMENTS

WO WO-2008130161 A1 * 10/2008 ........ H03M 13/2757

OTHER PUBLICATIONS

"European Application Serial No. 25162896.2, Extended European Search Report mailed Aug. 5, 2025", 10 pgs.

* cited by examiner

*Primary Examiner* — Guerrier Merant
(74) *Attorney, Agent, or Firm* — Schwegman Lundberg & Woessner, P.A.

(57) ABSTRACT

Encoding techniques are described for gate driving that take advantage of having multiple data channels to encode data and use a symbol-based encoding system to enhance data transmission speed and reliability. By encoding logic inputs (0, 1) into symbols and using a dedicated synchronization mechanism, the techniques ensure accurate data framing and synchronization, effectively overcoming the limitations of traditional methods. This approach not only facilitates faster transmission of fault data across an isolation barrier but also significantly improves the system's overall efficiency and reliability in controlling gates for traction drives.

20 Claims, 6 Drawing Sheets

ENCODING OVER MULTIPLE DATA CHANNELS

FIELD OF THE DISCLOSURE

This document pertains generally, but not by way of limitation, to digital communication systems, and more particularly to the processes of data serialization, encoding, and transmission over channels.

BACKGROUND

In digital communication, the efficient transmission of data over physical mediums is a cornerstone of modern computing and telecommunications. Data serialization, a process where data structures or object states are converted into a format that can be stored or transmitted and reconstructed later, plays an important role in the digital domain. Serialization allows complex data to be transmitted between different components of a system, or across networks, by transforming it into a linear, sequential format. This may be particularly important in scenarios where bandwidth is limited or where data integrity during transmission is paramount. Various serialization techniques have been developed to cater to different types of data and transmission requirements, including 8b/10b, Manchester, non-return to zero inverted (NRZI), and other line encodings, each offering unique advantages in terms of efficiency, readability, and ease of use.

Encoding techniques further enhance the process of data transmission by transforming data into a more robust format that can withstand errors or interference during transmission. One common approach is to increase redundancy in the data, allowing the receiver to detect and correct errors without the need for retransmission. For example, Forward Error Correction (FEC) codes, such as block codes and convolutional codes, are widely used in communication systems to improve reliability and efficiency. Additionally, encoding can also serve to compress data, reducing the amount of bandwidth required for transmission, or to secure data against unauthorized access. The choice of encoding scheme depends on the specific requirements of the communication system, including the expected error rates, available bandwidth, and security needs.

SUMMARY OF THE DISCLOSURE

This disclosure describes encoding techniques for gate driving that take advantage of having multiple data channels to encode data and use a symbol-based encoding system to enhance data transmission speed and reliability. By encoding logic inputs (0, 1) into symbols and using a dedicated synchronization mechanism, the techniques ensure accurate data framing and synchronization, effectively overcoming the limitations of traditional methods. This approach not only facilitates faster transmission of fault data across an isolation barrier but also significantly improves the system's overall efficiency and reliability in controlling gates for traction drives.

In some aspects, this disclosure is directed to a system for transmitting data, the system comprising: a serializer engine configured for receiving N bits of input data from a data source and grouping the data into M-bit slices of data; an encoder coupled with the serializer engine and configured for transforming each slice of data into P encoded bits; R channels connected to the serializer engine for transmitting the P encoded, wherein the P encoded bits are divided between the R channels; a deserializer engine coupled with the R channels and configured for receiving the transmitted P encoded bits; and a decoder coupled to the deserializer engine and configured for decoding the P encoded bits back into M-bit slices of data, wherein the deserializer engine is configured for reassembling the M-bit slices of data into N bits of output data representing the N bits of input data.

In some aspects, this disclosure is directed to a method for transmitting data, the method comprising: receiving N bits of data from a data source grouping the data into M-bit slices of data; transforming each slice of data into P encoded bits; transmitting the P encoded bits, wherein the P encoded bits are divided between R channels; receiving the transmitted P encoded bits; decoding the P encoded bits back into M-bit slices of data; and reassembling the M-bit slices of data into N bits of output data representing the N bits of input data.

In some aspects, this disclosure is directed to a system for transmitting data, the system comprising: a serializer engine configured for receiving N bits of input data from a data source and grouping the data into 3-bit slices of data, wherein the serializer engine is configured for inserting a start symbol, wherein the start symbol is distinct from any symbol representing data within a series of symbol pairs; an encoder coupled with the serializer engine and configured for transforming each slice of data into 4 encoded bits; 2 channels connected to the serializer engine for transmitting the 4 encoded bits, wherein the 4 encoded bits are divided between the 2 channels; a deserializer engine coupled with the 2 channels and configured for receiving the transmitted 4 encoded bits; and a decoder coupled to the deserializer engine and configured for decoding the 4 encoded bits back into M bit slices of data, wherein the deserializer engine is configured for reassembling the M bit slices of data into N bits of output data representing the N bits of input data.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the field of power electronics, the precise control of switching transistors, such as Insulated Gate Bipolar Transistors (IGBTs) and Field-Effect Transistors (FETs), is important for efficient operation. Traditional gate driving techniques often face challenges in maintaining signal integrity, especially when signals traverse isolation barriers. These barriers are used for safety and operational integrity but introduce complexities in signal transmission, particularly when dealing with high-speed data or fault data transmission across the high voltage and low voltage sides of a system. The present inventor has recognized that existing approaches to transmitting logic signals across these barriers often result in bandwidth limitations, synchronization issues, and potential data corruption, especially in systems requiring rapid fault detection and response. The present inventor has recognized a need for a system that uses a unique encoding scheme to transmit digital signals across the isolation barrier efficiently.

This disclosure describes encoding techniques for gate driving that take advantage of having multiple data channels to encode data and use a symbol-based encoding system to enhance data transmission speed and reliability. By encoding logic inputs (0, 1) into symbols and using a dedicated synchronization mechanism, the techniques ensure accurate data framing and synchronization, effectively overcoming the limitations of traditional methods. This approach not only facilitates faster transmission of fault data across an isolation barrier but also significantly improves the system's overall efficiency and reliability in controlling gates for traction drives. The encoding techniques, coupled with the use of multiple channels and a specialized synchronization strategy, represent a significant advancement in the field of power electronics and gate-driving technology.

Figure 1:
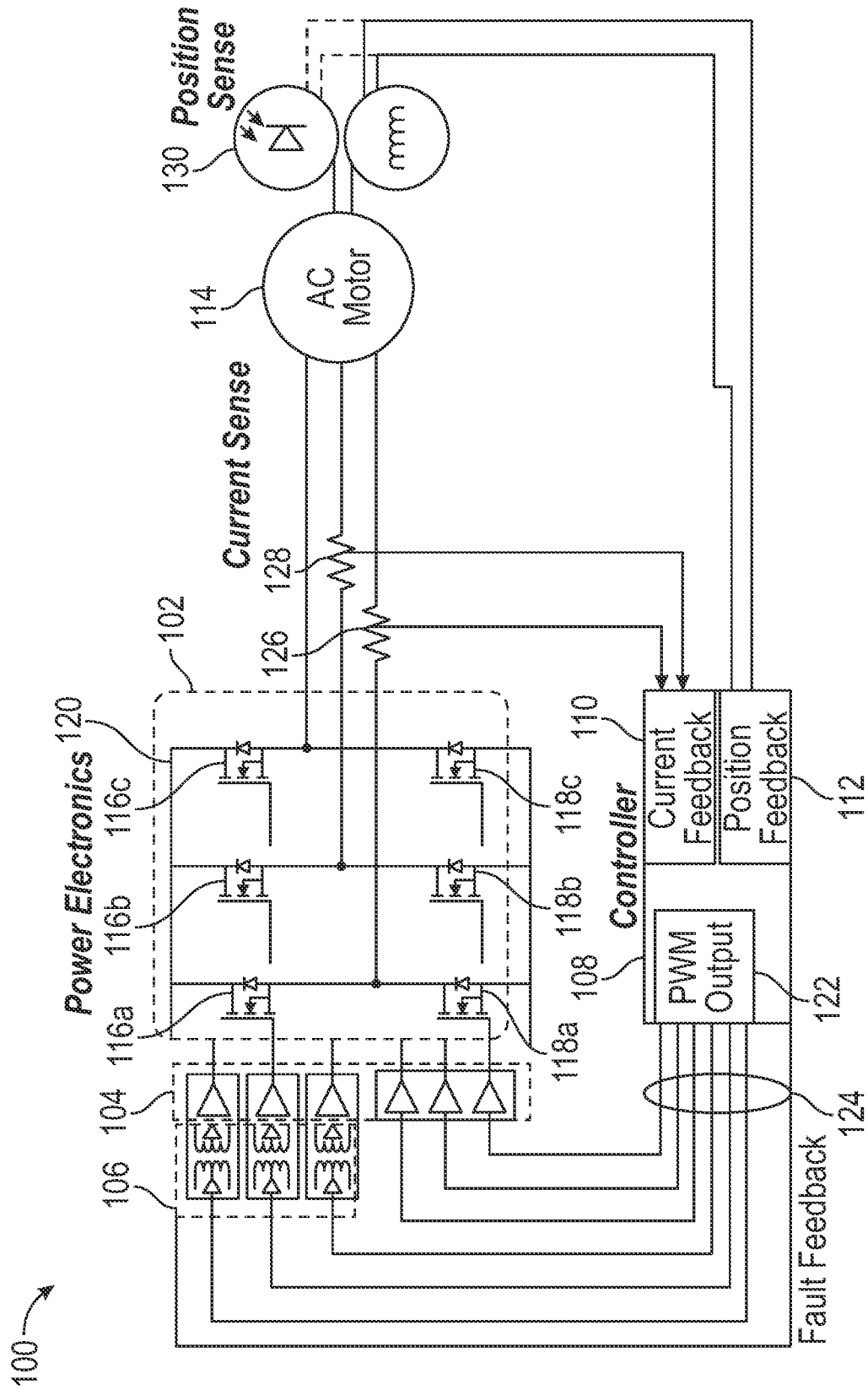
FIG. 1 is a simplified schematic diagram of an example of a current control system that may implement various techniques of this disclosure.

FIG. 1 is a simplified schematic diagram of an example of a current control system 100 that may implement various techniques of this disclosure. In the non-limiting example shown, the current control system 100 forms part of a motor drive signal chain, specifically designed for an alternating current (AC) motor. The current control system 100 includes a three-phase half-bridge circuit 102, gate driver circuits 104, isolator components 106, a controller 108 with a current feedback circuit 110 and a position feedback circuit 112, and sensors, all of which contribute to the precise and efficient operation of the AC motor 114.

The three-phase half-bridge circuit 102 includes six transistors, namely the transistors 116a-116c and the transistors 118a-118c, arranged into three half-bridge configurations. Each half-bridge, e.g., the transistor 116a and the transistor 118a, is responsible for driving one phase of the AC motor 114. The controller 108 controls the transistors within these bridges to switch on and off in a synchronized manner, facilitating the precise control of electrical current flowing through the windings of the AC motor 114. This control is pivotal in managing the speed and torque of the AC motor 114.

Integral to the operation of the three-phase half-bridge circuit 102 are the gate driver circuits 104, which are coupled with the control terminals, e.g., gate terminals, of the transistors, such as Insulated Gate Bipolar Transistors (IGBTs) and Field-Effect Transistors (FETs). The gate driver circuits 104 provide the necessary drive voltage to actuate the transistors, ensuring efficient switching.

For the top half of the three-phase half-bridge circuit 102, which includes the transistors 116a-116c, isolator components 106 are coupled with a gate driver circuit 104. The transistors 116a-116c are coupled with a high voltage supply 120, such as coupled with a battery stack in an electric vehicle. In some examples, the high voltage supply 120 may be 400 volts or higher. The isolator components 106 electrically isolate the low-voltage control side of the gate drivers, such as the side coupled with the controller 108, from the high-voltage power side of the three-phase half-bridge circuit 102. Such isolation protects the controller 108 from high-voltage transients and facilitates safe signal transmission between the controller 108 and the gate driver circuit 104.

The controller 108 is part of a gate driver system configured to control the operation of power electronics based on transmitted data. The controller 108 includes a Pulse Width Modulation (PWM) output circuit 122. The PWM output circuit 122 generates PWM output signals 124 directed to the gate driver circuit 104. The PWM output signals 124 modulate the duty cycle of the transistor switching, thereby controlling the power delivered to the windings of the AC motor 114. Additionally, the controller 108 is equipped with a current feedback circuit 110 and a position feedback circuit 112, which allow closed-loop control.

The current feedback circuit 110 is designed to receive input from a current sensor, such as formed by a current sense resistor 126 and a current sense resistor 128, which are positioned in two phases of the three-phase half-bridge circuit 102. The current feedback circuit 110, via the current sensor, monitor the current flowing through the windings of the AC motor 114, provides real-time feedback to the controller 108. Using this information, the controller 108 may adjust the PWM output signals 124 to ensure the AC motor 114 operates within desired parameters.

The current control system 100 also includes a position sensor 130, such as an optical sensor or a rotary encoder, coupled with the AC motor 114. The position sensor 130 provides precise feedback on the rotor position to the position feedback circuit 112 within the controller 108. Accurate position feedback is important for controlling the speed and position of the AC motor 114 with precision, enabling applications that demand exact motion control.

The current control system 100 is designed to couple each phase of the three-phase half-bridge circuit 102 with a winding in the AC motor 114, facilitating the conversion of electrical energy into mechanical motion. The inclusion of a current sensor and a position sensor provide the necessary feedback for the controller 108 to fine-tune the operation of the AC motor 114 in real-time, thereby optimizing performance and efficiency.

In a motor drive system, such as those implemented in electric vehicle traction drives, an alternating current motor, e.g., AC motor 114, is driven by a three-phase half-bridge circuit controlled by a system controller, e.g., the controller 108. The system controller enables each transistor of the three-phase half-bridge circuit with pulse width modulated patterns, such as generated by PWM output circuit 122. The delivered current from the three-phase half-bridge circuit into the inductance of the motor windings of the AC motor appears as a three-phase sine wave. A function of traction drive system controllers is to operate the motor safely and protect the system and maintain control on the vehicle in system shorts or vehicle accidents.

Figure 2:
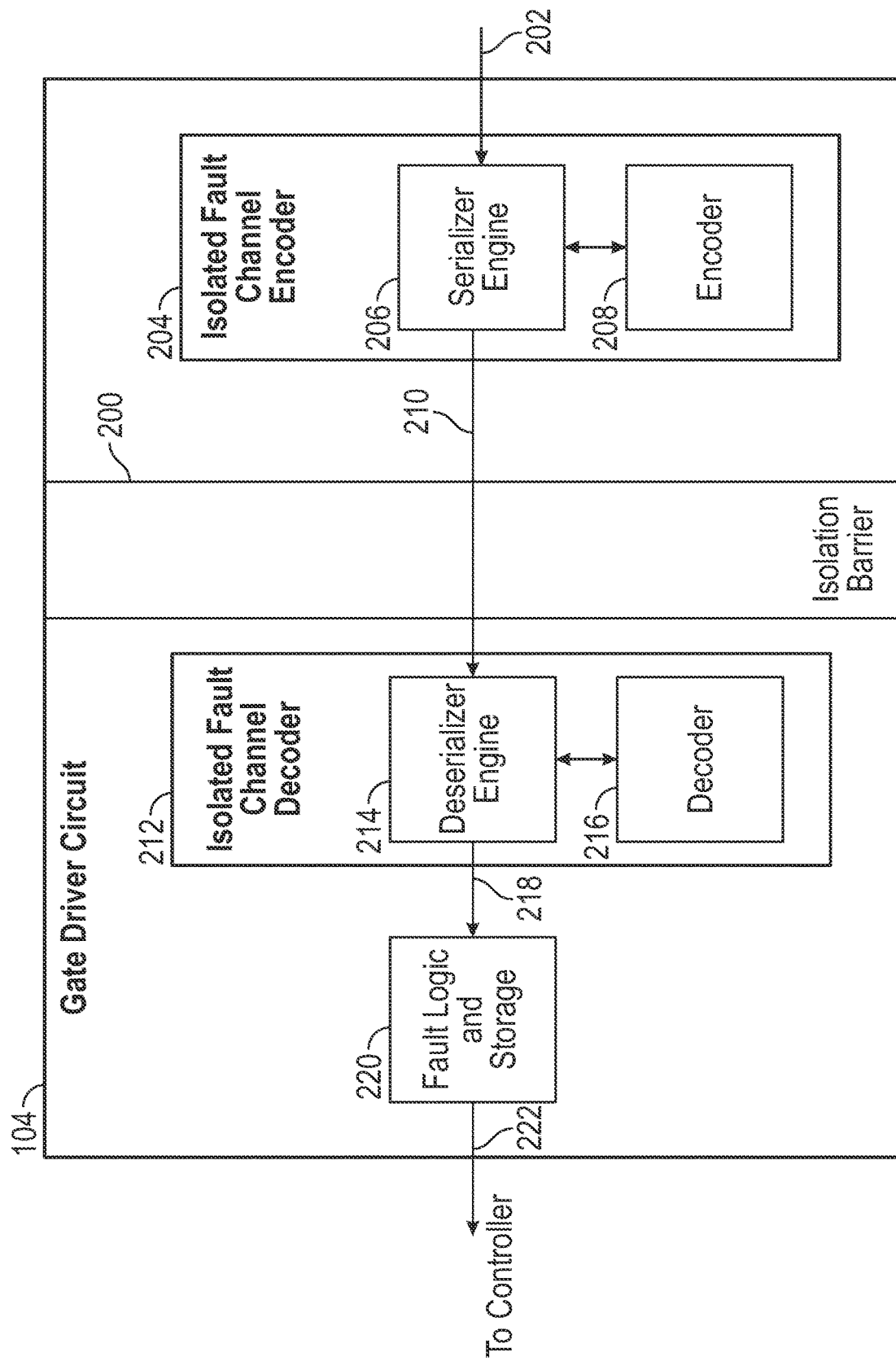
FIG. 2 is a block diagram of an example of a fault controller of the isolated gate driver circuit of FIG. 1.

FIG. 2 is a block diagram of an example of a fault controller of the isolated gate driver circuit of FIG. 1. The gate driver circuit 104 includes an isolation barrier 200 to electrically isolate the control circuits (low-voltage side) from the power circuits (high-voltage side), such as those coupled with the high voltage supply 120 of FIG. 1. This isolation is important for safety, preventing high voltages from reaching the control side and protecting users and sensitive electronic components from electric shock or damage. Data 202 is received by the controller 108 and, in particular, by the Isolated Fault Channel Encoder 204. The Isolated Fault Channel Encoder 204 includes a serializer engine 206 and an encoder 208.

The serializer engine 206 converts the data 202 from a parallel data stream to a serial data stream. Using various techniques of this disclosure and as described in more detail below, the encoder 208 uses a symbol-based encoding system to enhance data transmission speed and reliability. By encoding logic inputs (0, 1) into symbols and using a dedicated synchronization mechanism, the encoder 208 applies a specific coding scheme to the serial data stream to enhance transmission characteristics, such as error detection, error correction, synchronization, and signal integrity. The serializer engine 206 then transmits the encoded data 210 across the isolation barrier 200. The Isolated Fault Channel Decoder 212 and, in particular, the deserializer engine 214 receives the encoded data 210. The deserializer engine 214 converts the encoded data 210 from a serial data stream to a parallel data stream. A decoder 216 decodes the encoded data 210 and transmits the decoded data 218. In some examples, the decoded data 218 is fault data of an isolated gate driver system, and the fault data may be transmitted to a fault logic and storage 220 to process and store the decoded data 218 and generate an output signal 222. Depending on which fault was reported, the fault logic block may assert a general FAULT output signal to the external controller 108 or choose to disable the primary input path and turn off the gate 104 as part of a safety response mechanism.

Figure 3:
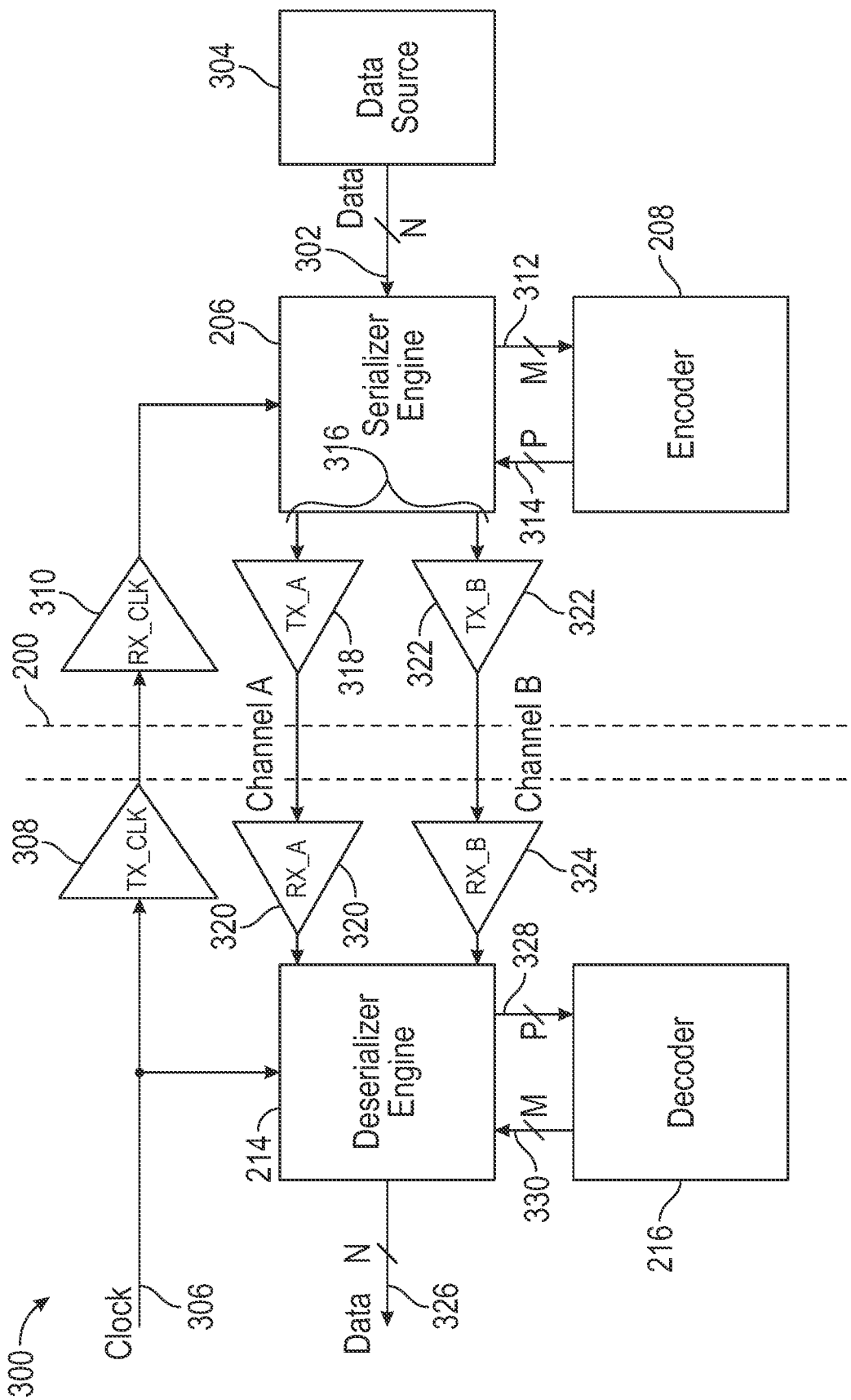
FIG. 3 is a block diagram depicting the controller of FIG. 2 in more detail.

FIG. 3 is a block diagram depicting an example of a system for transmitting data. The system 300 forms part of the controller of FIG. 2. The system 300 includes the serializer engine 206, the encoder 208, the deserializer engine 214, and the decoder 216 of FIG. 2.

The serializer engine 206 is configured for receiving N bits of input data 302 from a data source 304 and grouping the input data 302 into M-bit slices of data, e.g., 3-bit slices of data. Slices of data are ordered segments of the data stream that are the same width as the M-bit encoder input of encoder 208. The N bits of input data may include fault data of an isolated gate driver system, such as faults detected in transistors within the three-phase half-bridge circuit 102 of FIG. 1. The serializer engine 206 groups the data into M-bit slices in preparation for encoding.

The serializer engine 206 is configured for receiving a clock signal 306 to coordinate timing. The clock signal 306 may be amplified by a first clock amplifier 308, e.g., a transmit amplifier, before crossing the isolation barrier 200, and then amplified again by a second clock amplifier 310, e.g., a receive amplifier.

The encoder 208, e.g., an M to P encoder, is coupled with the serializer engine 206 and configured for receiving the M-bit slices of data 312 and transforming each slice of data into P encoded bits 314, e.g., 4 encoded bits. This transformation is designed to take advantage of an R channel communication medium, enhancing the distinction between control bits and data bits, thereby improving the robustness of the system.

The system 300 includes R channels 316, e.g., 2 channels, connected to the serializer engine 206 for transmitting the P encoded bits across the isolation barrier 200, where the P encoded bits are divided between the R channels. The P encoded bits are divided between the R channels, ensuring that the data is transmitted sequentially and efficiently. For simplicity, only 2 channels are depicted in FIG. 3, namely channel A and channel B. Each channel may include two amplifiers: a transmit amplifier and a receive amplifier. Data in channel A may be amplified by a transmit amplifier 318 before crossing the isolation barrier 200 and then amplified again by a receive amplifier 320 after crossing the isolation barrier 200. Similarly, data in channel B may be amplified by a transmit amplifier 322 before crossing the isolation barrier 200 and then amplified again by a receive amplifier 324 after crossing the isolation barrier 200.

The deserializer engine 214 is coupled with the R channels 316 and configured for receiving the transmitted P encoded bits. For example, the deserializer engine 214 is coupled with the receive amplifier 320 of channel A and the receive amplifier 324 of channel B.

The decoder 216 is coupled with the deserializer engine 214 and configured for decoding the P encoded bits 328 back into M-bit slices of data 330. Then, the deserializer engine 214 is configured for reassembling the M-bit slices of data 330 into N bits of output data 326 representing the N bits of input data 302. This reassembly process ensures that the data, once transmitted across the isolation barrier 200, is accurately reconstructed, maintaining the integrity of the data, e.g., fault data, for further processing or action by the system controller, e.g., controller 108 of FIG. 1.

The system is particularly advantageous in applications where fault data is important for the operational safety and functionality of power electronics. By providing a robust and efficient method for data transmission across an isolation barrier, the system ensures that fault data is quickly and accurately communicated, enabling timely responses to fault conditions.

The invention may be implemented using various encoding schemes, including Single Data Rate (SDR) or Double Data Rate (DDR), depending on the specific requirements of the application. The system's flexibility allows it to be adapted to different gate driver configurations and operational environments, making it a versatile solution for isolated data transmission challenges in power electronics.

Figure 4A:
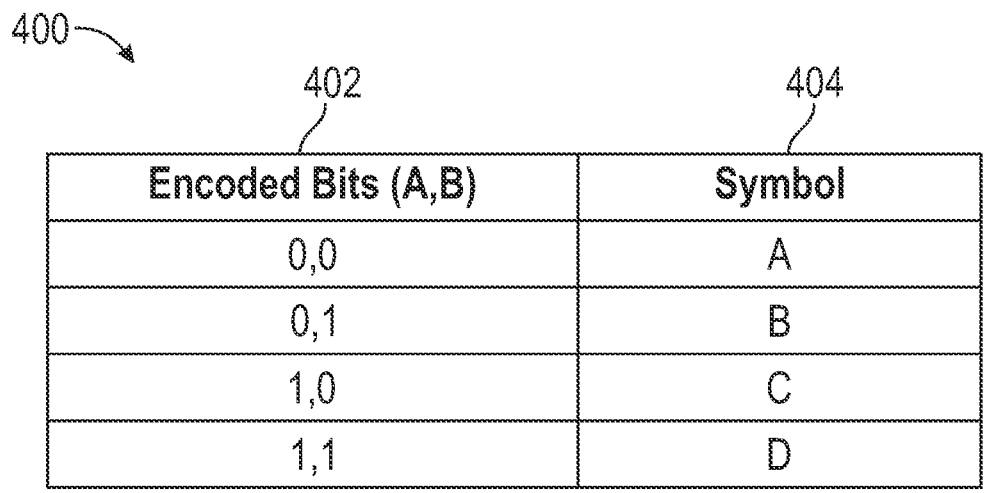
FIG. 4A is an example of a table depicting encoded bits mapped to corresponding symbols.

FIG. 4A is an example of a table 400 depicting encoded bits 402 mapped to corresponding data symbols 404. The encoder, such as the encoder 208 of FIG. 3, takes advantage of the R channels to uniquely encode data. In accordance with this disclosure, the encoder maps each of the four logic permutations of encoded bits 402 ([0,0], [0,1], [1,0], [1,1]) to corresponding data symbols 404 {A, B, C, D}. The permutations are transmitted over the R channels 316 of FIG. 3. For example, the permutations of the encoded bits 402 are transmitted over Channel A and Channel B. As an example, in [0,1], the bit 0 is transmitted over Channel A and the bit 1 is transmitted over Channel B. Similarly, in [1,0], the bit 1 is transmitted over Channel A and the bit 0 is transmitted over Channel B.

Further, {A,B,C} are used as data and one unique symbol {D} is reserved for the SYNC/START bit. The unique start bit assists in synchronizing the deserializer engine 214 with the data stream, ensuring that the deserializer engine 214 knows when the first bit of data is being received. This prevents the deserializer engine 214 from getting out of sync and misinterpreting which bit is being read, which would otherwise lead to corrupted data. The unique start bit also acts as a framing bit, allowing the deserializer engine 214 to frame the data correctly and know when a new data packet starts. By using a unique symbol that cannot be confused with the data, the encoding scheme ensures that the deserializer engine 214 may easily distinguish between control patterns (like the start bit) and actual data. This reduces the complexity of the encoding and the potential for errors.

Figure 4B:
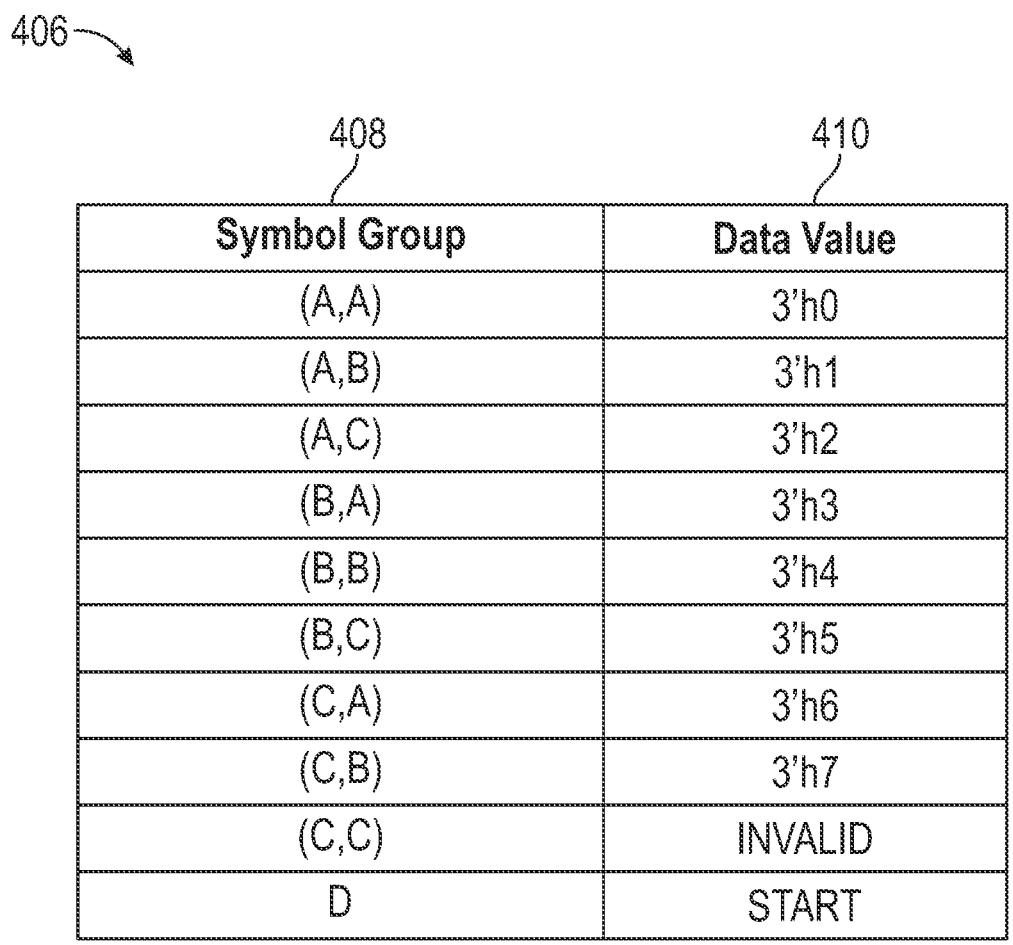
FIG. 4B is an example of a table depicting symbol groups mapped to corresponding data values.

FIG. 4B is an example of a table 406 depicting symbol groups 408 mapped to corresponding data values 410. A symbol group is an ordered collection of symbols used to encode a given slice of data. Each symbol represents a single sampling event of the R data channels.

As seen in table 406, the data symbols 404 {A,B,C,D} of table 400 (FIG. 4A) are grouped into symbol group 408 and assigned a unique M-bit raw data value. In the particular example shown in table 406, the symbol groups 408 includes symbol pairs, e.g., {(A,A), (A,B), (A,C) . . . (C,B)} and the unique M-bit raw data values include 0-7, shown in the format of 3'hX, where 3 represents the particular M-bit value, h represents hexadecimal, and X represents the data value. The symbol group (C,C) represents a RESERVED value and the symbol {D} represents a START bit. In the non-limiting example shown, the RESERVED value is assigned an INVALID value.

The encoder, e.g., the encoder 208 of FIG. 3, is configured for encoding the symbol groups 408 into encoded data and the serializer engine, e.g., the serializer engine 206 of FIG. 3, is configured for inserting the start symbol {D} into the encoded symbol groups 408 before transmitting the encoded data over the R channels, such as over Channel A and Channel B of FIG. 3. The start symbol {D} is distinct from any symbol {A,B,C} representing data within a series of symbol groups, such as {(A,A), (A,B), (A,C) . . . (C,B)}.

Using the techniques of this disclosure, three bits of decoded data are transmitted in two clock cycles SDR over two data channels. In addition, the SYNC/START pattern is reduced to one unique data symbol, namely {D}. These techniques achieve 75% efficiency, which is higher than other existing approaches for encoding schemes requiring a unique frame signature or data pattern, such as by using a unique start data code {D} as in this disclosure.

Figure 5:
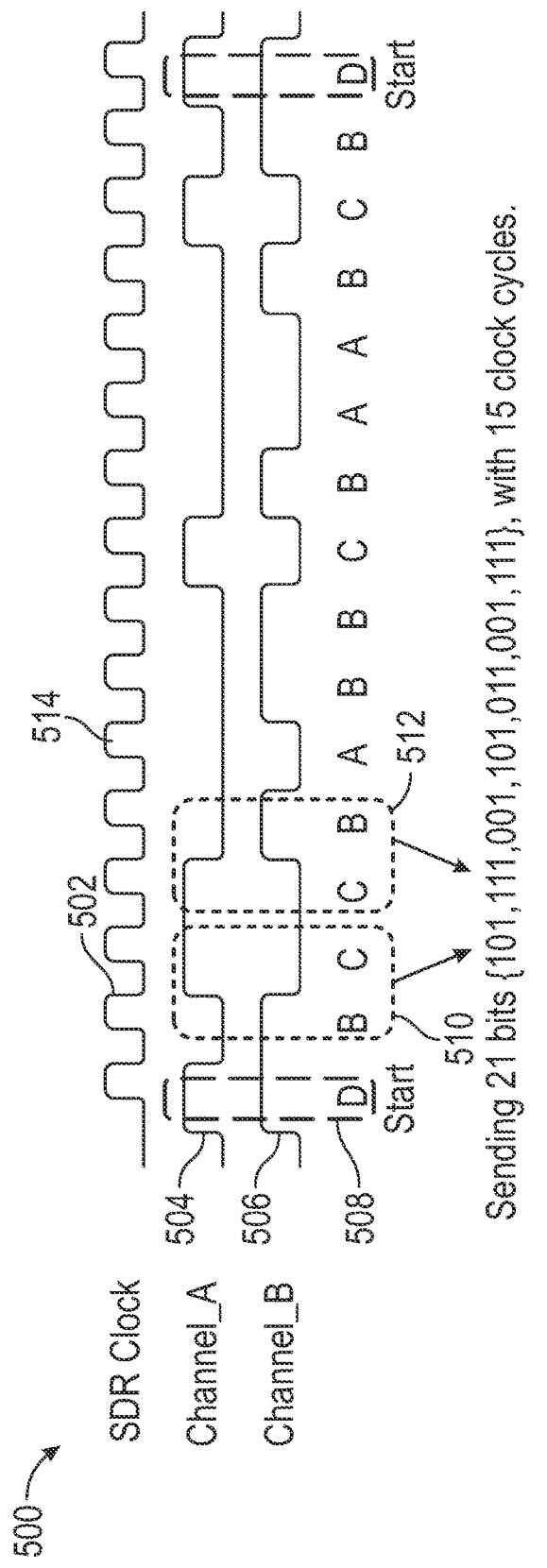
FIG. 5 is an example of a timing diagram showing 21 bits transmitted over two channels using a Single Data Rate (SDR) encoding scheme and various techniques of this disclosure.

FIG. 5 is an example of a timing diagram 500 showing 21 bits transmitted over two channels using a Single Data Rate (SDR) encoding scheme and various techniques of this disclosure. The timing diagram 500 includes an SDR clock signal 502, a Channel A data signal 504 and a Channel B data signal 506. Referring to FIG. 3, the clock signal 306 is the SDR clock signal 502, and the Channel A data signal 504 and the Channel B data signal 506 are transmitted by the serializer engine 206 over Channel A and Channel B of the R channels 316. With the SDR clock signal 502, the deserializer engine, such as the deserializer engine 214 of FIG. 3, may capture the data on either the rising or falling edge of the clock signal.

Receiving a first start symbol 508 {D} communicates to the deserializer engine, such as the deserializer engine 214 of FIG. 3, that a first symbol group is next. In the example shown, 21 bits are transmitted with 15 clock cycles 514. Symbol group 510 is the first symbol group and, in FIG. 5, is the symbol pair (B,C), also represented as 3' h 5 or 101 (in binary). As seen, the B in the symbol pair (B,C) is represented by a logic level 0 on Channel A and a logic level 1 on channel B, and the C in the symbol pair (B,C) is represented by a logic level 1 on Channel A and a logic level 0 on channel B. This corresponds with the encoded bits 402 (0,1)=B and (1,0)=C in table 400 of FIG. 4A.

Symbol group 512 is the second symbol group and, in FIG. 5, is the symbol pair (C,B), also represented as 3'h7 or 111 (in binary). As seen, the C in the symbol pair (C,B) is represented by a logic level 1 on Channel A and a logic level 0 on channel B, and the B in the symbol pair (C,B) is represented by a logic level 0 on Channel A and a logic level 1 on channel B. This corresponds with the encoded bits 402 (1,0)=C and (0,1)=B in table 400 of FIG. 4A.

Five other symbol groups are depicted in FIG. 5, namely AB, BC, BA, AB, and CB, and for brevity, will not be described in detail. In this manner, the encoding scheme transmits N bits, e.g., 21 bits {101,111,001,101,011,001,111}, with 15 clock cycle 514 using two channels. Each of the M-bit groupings {101,111,001 . . . } of the N bits, e.g., 3-bits in this example, are referred to in this disclosure as "slices of data".

Figure 6:
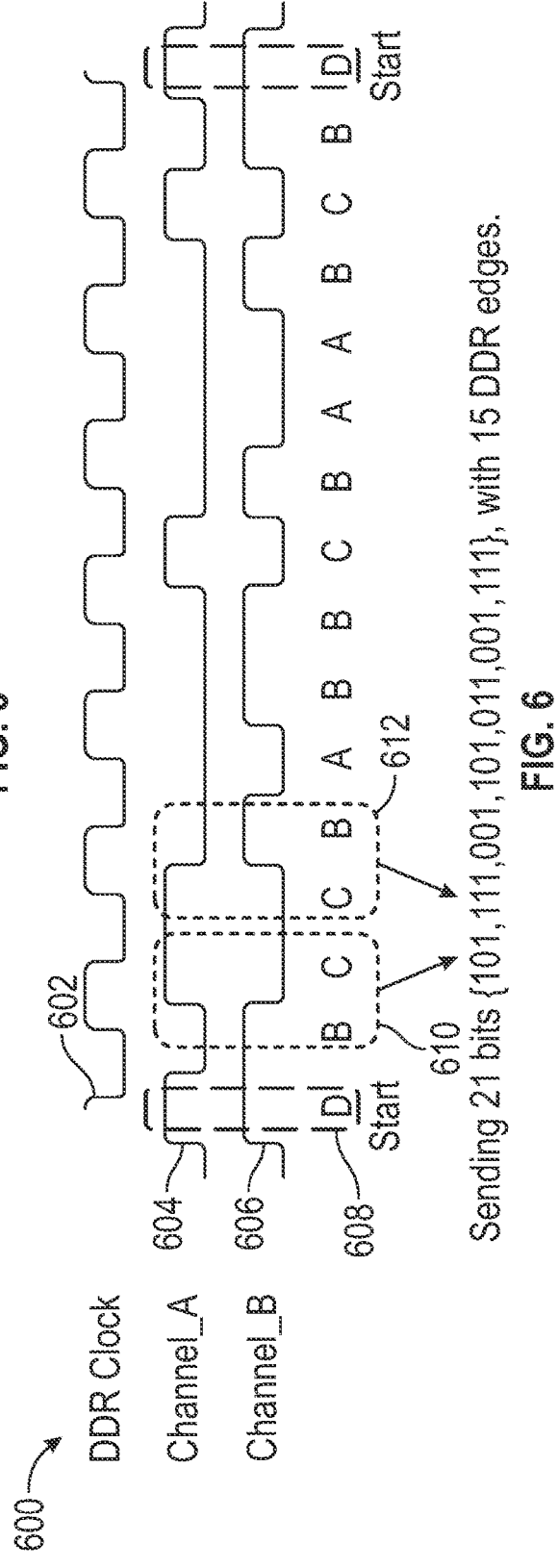
FIG. 6 is an example of a timing diagram showing 21 bits transmitted over two channels using a Double Data Rate (DDR) encoding scheme and various techniques of this disclosure.

FIG. 6 is an example of a timing diagram 600 showing 21 bits transmitted over two channels using a Double Data Rate (DDR) encoding scheme and various techniques of this disclosure. The timing diagram 600 includes a DDR clock signal 602, a Channel A data signal 604 and a Channel B data signal 606. Referring to FIG. 3, the clock signal 306 is the DDR clock signal 602, and the Channel A data signal 604 and the Channel B data signal 606 are transmitted by the serializer engine 206 over Channel A and Channel B of the R channels 316. With the DDR clock signal 602, the deserializer engine, such as the deserializer engine 214 of FIG. 3, may capture the data on both the rising and falling edges of the clock signal.

Receiving a first start symbol 608 {D} communicates to the deserializer engine, such as the deserializer engine 214 of FIG. 3, that a first symbol group is next. In the example shown, 21 bits are transmitted with 15 DDR edges. Symbol group 610 is the first symbol group and, in FIG. 6, is the symbol pair (B,C), like in FIG. 5. Symbol group 612 is the second symbol group and, in FIG. 6, is the symbol pair (C,B). The details of these symbol groups are described above with respect to FIG. 5.

Five other symbol groups are depicted in FIG. 6, namely AB, BC, BA, AB, and CB, and for brevity, will not be described in detail. In this manner, the encoding scheme transmits 21 bits {101,111,001,101,011,001,111} with 15 DDR edges using two channels. Each of the M-bit groupings {101,111,001 . . . }, e.g., 3-bits in this example, are referred to in this disclosure as "slices of data".

Figure 7:
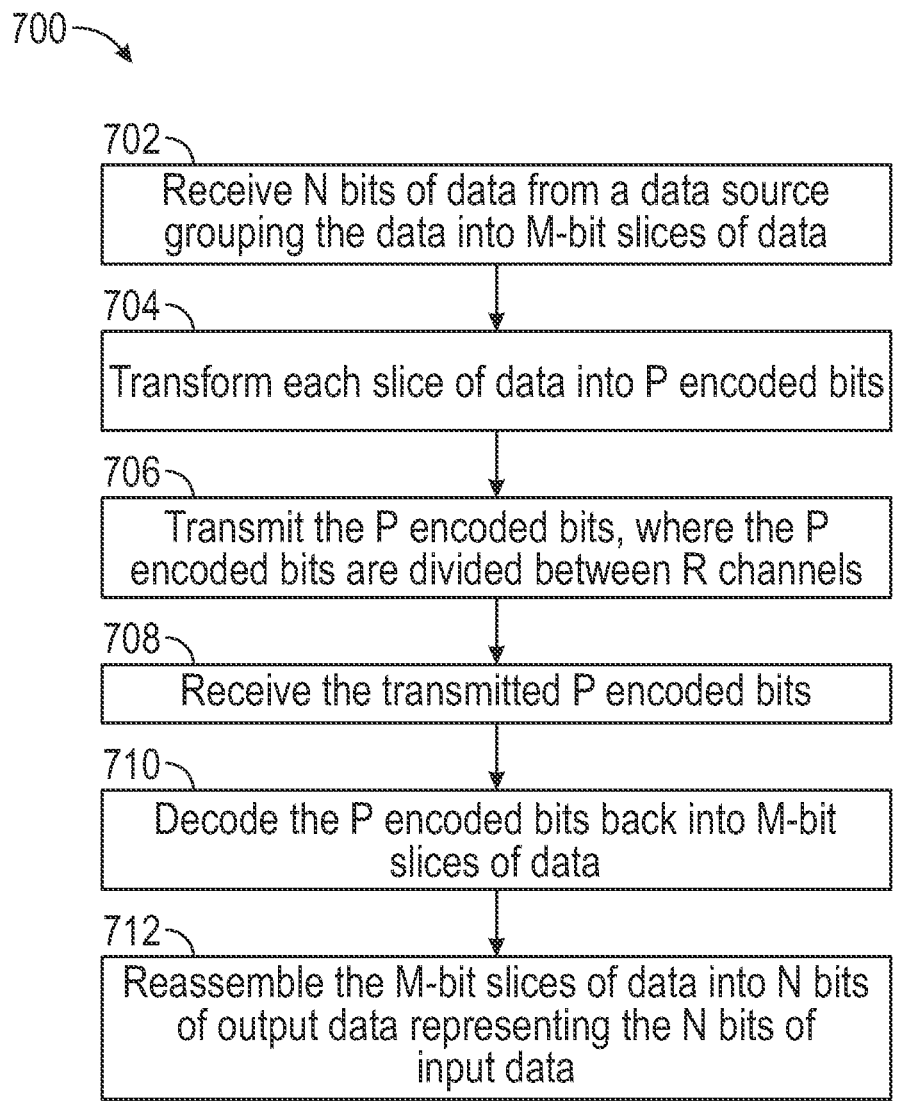
FIG. 7 is a block diagram of an example of a method 700 for transmitting data.

FIG. 7 is a block diagram of an example of a method 700 for transmitting data. At block 702, the method 700 receives N bits of data from a data source grouping the data into M-bit slices of data. For example, the serializer engine 206 of FIG. 3 receives fault data of an isolated gate driver system.

At block 704, the method 700 transforms each slice of data into P encoded bits. For example, the serializer engine 206 of FIG. 3 transforms each slice of data into P encoded bits. In some examples, M is 3 and P is 4.

At block 706, the method 700 transmits the P encoded bits, wherein the P encoded bits are divided between the R channels. For example, the serializer engine 206 of FIG. 3 divides the P encoded bits between 2 channels and transmits.

At block 708, the method 700 receives the transmitted P encoded bits. For example, the deserializer engine 214 of FIG. 3 receives the transmitted encoded bits.

At block 710, the method 700 decodes the P encoded bits back into M-bit slices of data. For example, the decoder 216 of FIG. 3 decodes the P encoded bits back into M-bit slices of data.

At block 712, the method 700 reassembles the M-bit slices of data into N bits of output data representing the N bits of input data. For example, the deserializer engine 214 of FIG. 3 performs the reassembly.

In some examples, the method 700 encodes the M-bit slices of data using a Single Data Rate (SDR) encoding scheme. In other examples, the method 700 encodes the M-bit slices of data using a Double Data Rate (DDR) encoding scheme.

In some examples, the method 700 encodes the M-bit slices of data into a series of symbol groups. As an example, the method 700 encodes the M-bit slices of data into a series of symbol pairs, e.g., {(A,A), (A,B), (A,C) . . . (C,B)}.

In some examples, the method 700 inserts a start symbol, where the start symbol is distinct from any symbol representing data within a series of symbol groups. For example, if {A,B,C} are used as data, then one unique symbol {D} is reserved for the SYNC/START bit.

Various Notes

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A system for transmitting data, the system comprising:
a serializer engine configured for receiving N bits of input data from a data source and grouping the data into M-bit slices of data;
an encoder coupled with the serializer engine and configured for transforming each slice of data into P encoded bits;
R channels connected to the serializer engine for transmitting the P encoded, wherein the P encoded bits are divided between the R channels;
a deserializer engine coupled with the R channels and configured for receiving the transmitted P encoded bits; and
a decoder coupled to the deserializer engine and configured for decoding the P encoded bits back into M-bit slices of data, wherein the deserializer engine is configured for reassembling the M-bit slices of data into N bits of output data representing the N bits of input data.

2. The system of claim 1, wherein the encoder is configured for encoding the M-bit slices of data using a Single Data Rate (SDR) encoding scheme.

3. The system of claim 1, wherein the encoder is configured for encoding the M-bit slices of data using a Double Data Rate (DDR) encoding scheme.

4. The system of claim 1, wherein the encoder is configured for encoding the input data into a series of symbol groups.

5. The system of claim 4, wherein the symbol groups include symbol pairs.

6. The system of claim 1, wherein the serializer engine is configured for inserting a start symbol, and wherein the start symbol is distinct from any symbol representing data within a series of symbol groups.

7. The system of claim 1, wherein the encoder and the decoder are part of a gate driver system.

8. The system of claim 1, wherein the data is fault data of an isolated gate driver system.

9. The system of claim 1, wherein M is 3 and P is 4.

10. A method for transmitting data, the method comprising:
receiving N bits of data from a data source;
grouping the data into M-bit slices of data;
transforming each slice of data into P encoded bits;

transmitting the P encoded bits, wherein the P encoded bits are divided between R channels;

receiving, via a deserializer engine, the transmitted P encoded bits;

decoding, via a decoder coupled to the deserializer engine, the P encoded bits back into M-bit slices of data; and reassembling, by the deserializer engine, the M-bit slices of data into N bits of output data representing the N bits of input data.

11. The method of claim 10, comprising:

encoding the M-bit slices of data using a Single Data Rate (SDR) encoding scheme.

12. The method of claim 10, comprising:

encoding the M-bit slices of data using a Double Data Rate (DDR) encoding scheme.

13. The method of claim 10, comprising:

encoding the M-bit slices of data into a series of symbol groups.

14. The method of claim 13, wherein encoding the M-bit slices of data into the series of symbol groups includes:

encoding the M-bit slices of data into a series of symbol pairs.

15. The method of claim 10, comprising:

inserting a start symbol, wherein the start symbol is distinct from any symbol representing data within a series of symbol groups.

16. The method of claim 10, wherein M is 3 and P is 4.

17. A system for transmitting data, the system comprising:

a serializer engine configured for receiving N bits of input data from a data source and grouping the data into 3-bit slices of data, wherein the serializer engine is configured for inserting a start symbol, wherein the start symbol is distinct from any symbol representing data within a series of symbol pairs;

an encoder coupled with the serializer engine and configured for transforming each slice of data into 4 encoded bits;

2 channels connected to the serializer engine for transmitting the 4 encoded bits, wherein the 4 encoded bits are divided between the 2 channels;

a deserializer engine coupled with the 2 channels and configured for receiving the transmitted 4 encoded bits; and a decoder coupled to the deserializer engine and configured for decoding the 4 encoded bits back into M bit slices of data, wherein the deserializer engine is configured for reassembling the M bit slices of data into N bits of output data representing the N bits of input data.

18. The system of claim 17, wherein the encoder is configured for encoding the 3-bit slices of data using a Single Data Rate (SDR) encoding scheme.

19. The system of claim 17, wherein the encoder is configured for encoding the 3-bit slices of data using a Double Data Rate (DDR) encoding scheme.

20. The system of claim 17, wherein the encoder is configured for encoding the input data into a series of symbol pairs.

* * * * *